United States Patent
Song

(10) Patent No.: US 12,194,710 B2
(45) Date of Patent: Jan. 14, 2025

(54) DISPLAY DEVICE

(71) Applicant: Samsung Display Co., Ltd., Yongin-si (KR)

(72) Inventor: Juhee Song, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1 day.

(21) Appl. No.: 17/872,368

(22) Filed: Jul. 25, 2022

(65) Prior Publication Data

US 2023/0202144 A1     Jun. 29, 2023

(30) Foreign Application Priority Data

Nov. 25, 2021   (KR) ......................... 10-2021-0164882

(51) Int. Cl.

| | |
|---|---|
| *B32B 17/10* | (2006.01) |
| *B32B 5/18* | (2006.01) |
| *B32B 7/12* | (2006.01) |
| *B32B 27/08* | (2006.01) |
| *B32B 27/28* | (2006.01) |
| *B32B 27/30* | (2006.01) |
| *B32B 27/32* | (2006.01) |
| *B32B 27/36* | (2006.01) |
| *H05K 5/03* | (2006.01) |
| *B32B 27/06* | (2006.01) |

(52) U.S. Cl.
CPC ................ *B32B 17/10* (2013.01); *B32B 7/12* (2013.01); *B32B 27/08* (2013.01); *B32B 27/281* (2013.01); *B32B 27/286* (2013.01); *B32B 27/308* (2013.01); *B32B 27/325* (2013.01); *B32B 27/36* (2013.01); *B32B 27/365* (2013.01); *H05K 5/03* (2013.01); *B32B 5/18* (2013.01); *B32B 27/065* (2013.01); *B32B 2307/558* (2013.01); *B32B 2307/732* (2013.01); *B32B 2307/748* (2013.01); *B32B 2457/20* (2013.01)

(58) Field of Classification Search
None
See application file for complete search history.

(56) References Cited

U.S. PATENT DOCUMENTS

| | | |
|---|---|---|
| 8,552,299 B2 | 10/2013 | Rogers et al. |
| 2019/0235690 A1* | 8/2019 | Lee ........................ G06F 3/0416 |
| 2021/0036259 A1 | 2/2021 | Song et al. |

FOREIGN PATENT DOCUMENTS

KR    1020210016124 A    2/2021

* cited by examiner

*Primary Examiner* — Sheeba Ahmed
(74) *Attorney, Agent, or Firm* — CANTOR COLBURN LLP

(57) ABSTRACT

A display device includes: a display panel and a protective member disposed on the display panel. The protective member includes: a window disposed on the display panel; a protective layer disposed on the window; a first protective adhesive layer disposed between the window and the protective layer, and a second protective adhesive layer disposed between the display panel and the window. The first protective adhesive layer has a storage modulus of about 2 MPa to about 8 MPa at frequencies of about 20,000 Hz to about 100,000 Hz and a temperature of about 25° C. The second protective adhesive layer has a first loss factor of about 1.6 to about 2.5 at frequencies of about 20,000 Hz to about 100,000 Hz and a temperature of about 25° C.

20 Claims, 8 Drawing Sheets

DISPLAY DEVICE

This U.S. application claims priority to Korean Patent Application No. 10-2021-0164882, filed on Nov. 25, 2021, and all the benefits accruing therefrom under 35 U.S.C. § 119, the content of which in its entirety is herein incorporated by reference.

BACKGROUND

The present disclosure herein relates to a display device, and more particularly, to a foldable display device including an adhesive layer disposed on a display panel.

A display device provides information for a user by displaying various images on a display screen. In general, the display device displays information within an allocated screen. A flexible display device including a flexible display panel that is foldable or bendable is developed. The flexible display device may be folded, rolled, or bent unlike rigid display devices. The flexible display device which may be modified to various forms may be portable regardless of the existing screen size, thereby improving user's convenience.

An adhesive layer applied to the flexible display device is desirable to keep reliability against repeated folding or bending.

SUMMARY

The present disclosure provides a display device having excellent folding reliability and impact resistance.

An embodiment of the present invention provides a display device including: a display panel, which is foldable with respect to at least one folding axis; and a protective member disposed on the display panel. The protective member includes: a window disposed on the display panel: a protective layer disposed on the window: a first protective adhesive layer which is disposed between the window and the protective layer and has a storage modulus of about 2 megapascals (MPa) to about 8 MPa at frequencies of about 20,000 hertz (Hz) to about 100,000 Hz and a temperature of about 25 degrees in Celsius (C); and a second protective adhesive layer which is disposed between the display panel and the window and has a first loss factor (tan δ) of about 1.6 to about 2.5 at frequencies of about 20,000 Hz to about 100,000 Hz and a temperature of about 25° C.

In an embodiment, the protective member may further include: an impact absorbing layer disposed between the display panel and the second protective adhesive layer; and a third protective adhesive layer which is disposed between the display panel and the impact absorbing layer and has a second loss factor (tan δ) of about 1.6 to about 2.5 at frequencies of about 20,000 Hz to about 100,000 Hz.

In an embodiment, the second loss factor of the third protective adhesive layer may be a value at a temperature of about 25° C.

In an embodiment, the third protective adhesive layer may include an acrylate-based monomer.

In an embodiment, the first protective adhesive layer may have a thickness of about 25 micrometers (μm) to about 65 μm.

In an embodiment, the first protective adhesive layer may have a storage modulus of about 0.3 MPa or less at a temperature of about −20° C. and a frequency of about 1 Hz.

In an embodiment, the first protective adhesive layer may have a storage modulus of about 0.05 MPa or less at a temperature of about 25° C. and a frequency of about 1 Hz.

In an embodiment, the second protective adhesive layer may have a storage modulus of about 0.3 MPa or less at a temperature of about −20° C. and a frequency of about 1 Hz.

In an embodiment, the second protective adhesive layer may have a storage modulus of about 0.05 MPa or less at a temperature of about 25° C. and a frequency of about 1 Hz.

In an embodiment, each of the first protective adhesive layer and the second protective adhesive layer may include an acrylate-based monomer.

In an embodiment, each of the first protective adhesive layer and the second protective adhesive layer may include a thermosetting resin or a photocurable resin.

In an embodiment, the protective layer may include at least one of polyethylene terephthalate ("PET"), polyethylene naphthalate ("PEN"), polyether sulfone ("PES"), polyimide ("PI"), polyarylate ("PAR"), polycarbonate ("PC"), polymethyl methacrylate ("PMMA"), or cyclic olefin copolymer ("COC").

In an embodiment, the protective member may further include a functional layer disposed on the protective layer, and the functional layer may include at least one of an anti-fingerprint layer or a hard coating layer.

In an embodiment, the window may include a glass substrate.

In an embodiment, the display panel and the protective member may be foldable to have a radius of curvature of about 1 millimeters (mm) to about 5 mm with respect to the at least one folding axis.

In an embodiment of the present invention, a display device includes: a display panel, which is foldable with respect to at least one folding axis; and a protective member disposed on the display panel. The protective member includes: an impact absorbing layer disposed on the display panel: a window disposed on the impact absorbing layer: a protective layer disposed on the window; a first protective adhesive layer, which is disposed between the window and the protective layer and has a storage modulus of about 2 MPa to about 8 MPa at frequencies of about 20,000 Hz to about 100,000 Hz and a temperature of about 25° C.: a second protective adhesive layer, which is disposed between the display panel and the window and has a first loss factor (tan δ) of about 1.6 to about 2.5 at frequencies of about 20,000 Hz to about 100,000 Hz and a temperature of about 25° C.; and a third protective adhesive layer, which is disposed between the display panel and the impact absorbing layer and has a second loss factor (tan δ) of about 1.6 to about 2.5 at frequencies of about 20,000 Hz to about 100,000 Hz and a temperature of about 25° C.

In an embodiment, the first protective adhesive layer may have a thickness of about 25 μm to about 65 μm.

In an embodiment, each of the first protective adhesive layer, the second protective adhesive layer, and the third protective adhesive layer may have a storage modulus of about 0.3 MPa or less at a temperature of about −20° C. and a frequency of about 1 Hz.

In an embodiment, each of the first protective adhesive layer, the second protective adhesive layer, and the third protective adhesive layer may have a storage modulus of about 0.05 MPa or less at a temperature of about 25° C. and a frequency of about 1 Hz.

In an embodiment, each of the first protective adhesive layer, the second protective adhesive layer, and the third protective adhesive layer may include a thermosetting resin or a photocurable resin.

BRIEF DESCRIPTION OF THE FIGURES

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1A:
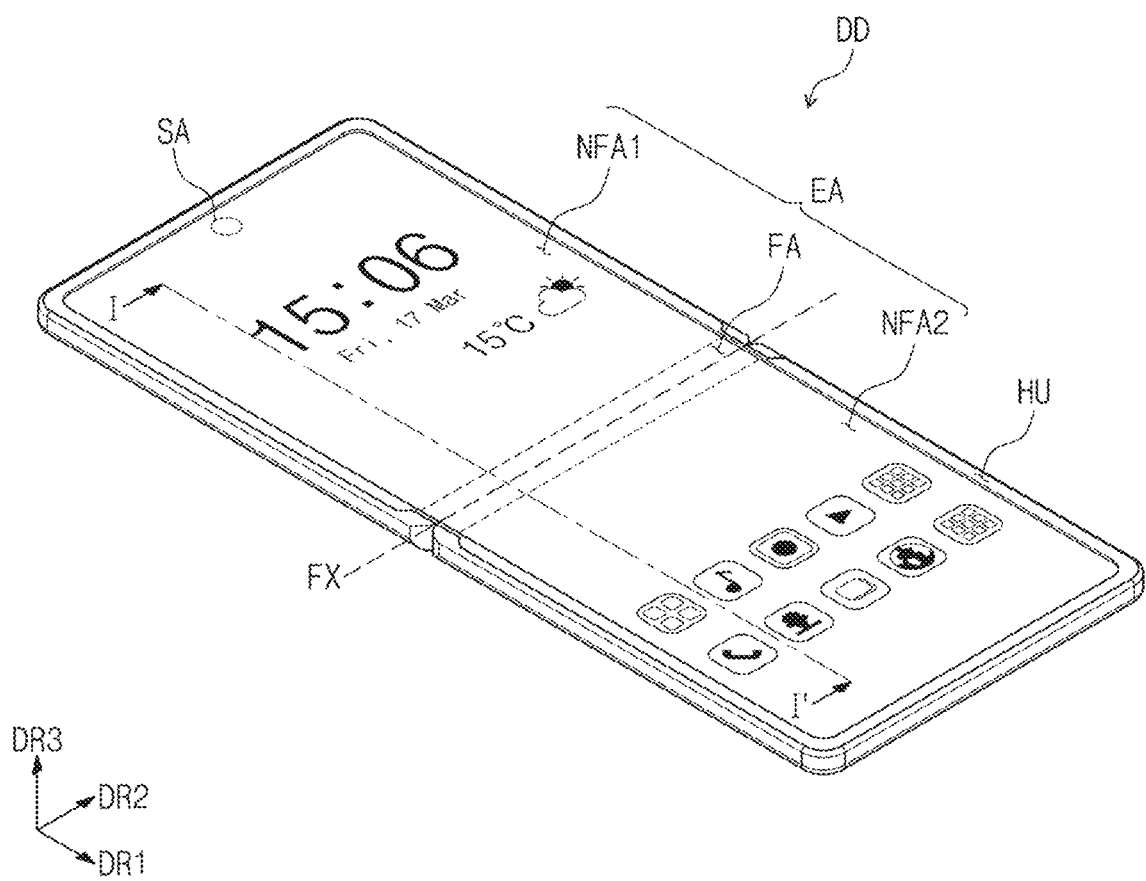
FIG. 1A is a perspective view illustrating a display device of an embodiment of the present invention.

The present invention may be modified in many alternate forms, and thus specific embodiments will be exemplified in the drawings and described in this text in detail. It should be understood, however, that it is not intended to limit the present invention to the particular forms disclosed, but rather, is intended to cover all modifications, equivalents, and alternatives falling within the spirit and scope of the invention.

In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals refer to like elements throughout. Also, in the drawings, the thicknesses, ratios, and dimensions of the components are exaggerated for effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes all combinations of one or more of which associated configurations may define.

It will be understood that, although the terms "first," "second," etc. may be used herein to describe various components, these components should not be limited by these terms. These terms are only used to distinguish one component from another. For example, a first component could be termed a second component, and, similarly, a second component could be termed a first component, without departing from the scope of the present invention. The terms of a singular form may include plural forms unless the context clearly indicates otherwise.

In addition, terms such as "below," "under," "on," and "above" may be used to describe the relationship between components illustrated in the figures. The terms are used as a relative concept and are described with reference to the direction indicated in the drawings.

It should be understood that the terms "comprise," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Unless otherwise defined, all terms (including technical and scientific terms) used herein have the same meaning as commonly understood by one of ordinary skill in the art to which the present invention belongs. In addition, it will be understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Figure 1B:
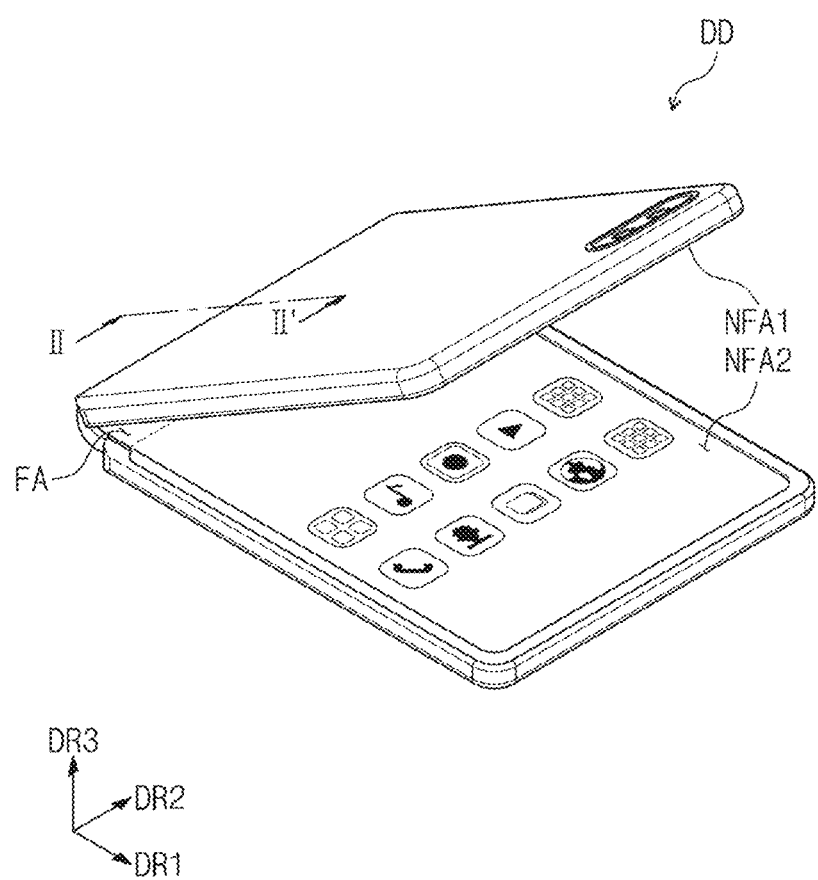
FIG. 1B is a perspective view illustrating a display device of an embodiment of the present invention.

Hereinafter, a display device according to an embodiment of the present invention will be described with reference to the drawings. FIG. 1A is a perspective view of a display device DD according to an embodiment. FIG. 1B is a perspective view illustrating an inner-folding process of the display device illustrated in FIG. 1A. The display device DD according to an embodiment may be a flexible display device which may be folded or bent or may be maintained in a folded state or bent state.

Referring to FIGS. 1A and 1B, a display device DD may be a device that is activated according to an electrical signal. In an embodiment, for example, the display device DD may be a portable electronic device, a personal digital terminal, a tablet, a car navigation unit, a game console, or a wearable device, but the embodiment of the present invention is not limited thereto. FIGS. 1A and 1B exemplarily illustrate that the display device DD is a portable electronic device.

The display device DD may display an image through an active region EA. The active region EA may include non-folding regions NFA1 and NFA2, and a folding region FA. The folding region FA may be bent with respect to a folding axis FX parallel to a direction in which a second directional axis DR2 extends.

When the display devices DD is folded, the non-folding regions NFA1 and NFA2 may face each other. In a fully folded state of the display device DD, the active region EA may not be exposed to the outside, which may be referred to as inner-folding. Alternatively, in a fully folded state of the display device DD of an embodiment, the active region EA may be exposed to the outside, which may be referred to as outer-folding.

The display device DD may be capable of performing either inner-folding or outer-folding. Alternatively, the display device DD may be capable of performing both inner-folding and outer-folding. In this case, the same region of the display device DD, for example, the folding region FA may be inner-folded and outer-folded. Alternatively, some regions of the display device DD may be inner-folded, and some other regions may be outer-folded.

FIGS. 1A and 1B illustrate that the folding axis FX is parallel to a minor axis of the display device DD, that is, a direction in which the second directional axis DR2 extends.

However, this is exemplary, and the embodiment of the present invention is not limited thereto. In another embodiment, for example, the folding axis FX may be parallel to a major axis of the display device DD, that is, a direction in which the first directional axis DR1 extends.

The display device DD may include a sensing region SA surrounded by the active region EA. In an embodiment, for example, the sensing region SA may overlap a camera module in a plan view. Here, the plan view is a view from the direction of the third directional axis DR3. FIG. 1A illustrates one sensing region SA, but the embodiment of the present invention is not limited thereto. The display device of an embodiment may include a plurality of sensing regions.

The display device DD may include a case HU. The case HU may accommodate a display panel DP and a protective member PLM, which will be described later.

The display device DD may have a three-dimensional shape having a preset thickness in a direction of a third directional axis DR3, which is the direction perpendicular to the plane defined by the first directional axis DR1 and the second directional axis DR2 crossing the first directional axis DR1. In the present specification, an upper surface (or a front surface) and a lower surface (or a rear surface) of each member are defined with respect to the direction in which the image is displayed in the active region EA. The upper and lower surfaces may oppose each other with respect to the third directional axis DR3, and the normal direction of each of the upper and lower surfaces may be parallel to the third directional axis DR3. The directions indicated by the first to third directional axes DR1, DR2, and DR3 are relative concepts, and may thus be changed to other directions. Hereinafter, first to third directions are the directions indicated by the first to third directional axes DR1, DR2, and DR3, respectively, and are denoted by the same reference symbols.

FIGS. 1A and 1B illustrate that the display device DD includes one folding region FA and two non-folding regions NFA1 and NFA2, but the number of folding and non-folding regions is not limited thereto. In another embodiment, for example, a display device may include three or more non-folding regions and two or more folding regions disposed between adjacent non-folding regions.

Figure 2A:
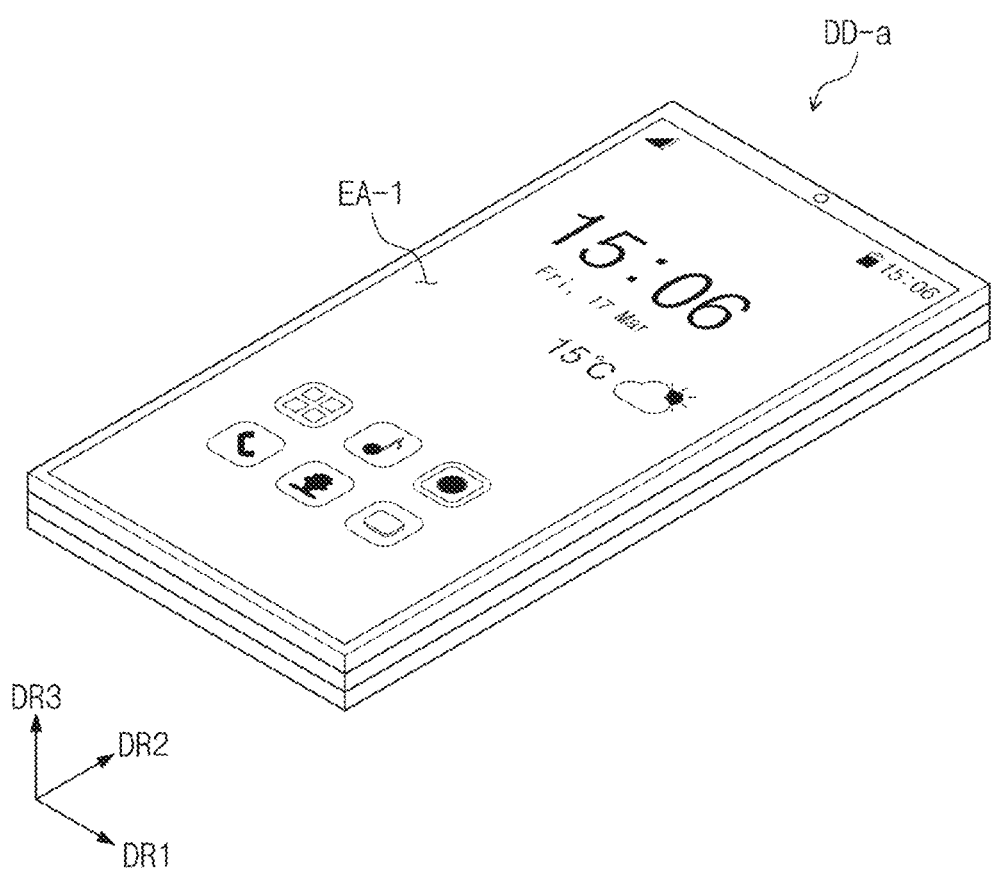
FIG. 2A is a perspective view illustrating a display device according to an embodiment of the present invention.
Figure 2B:
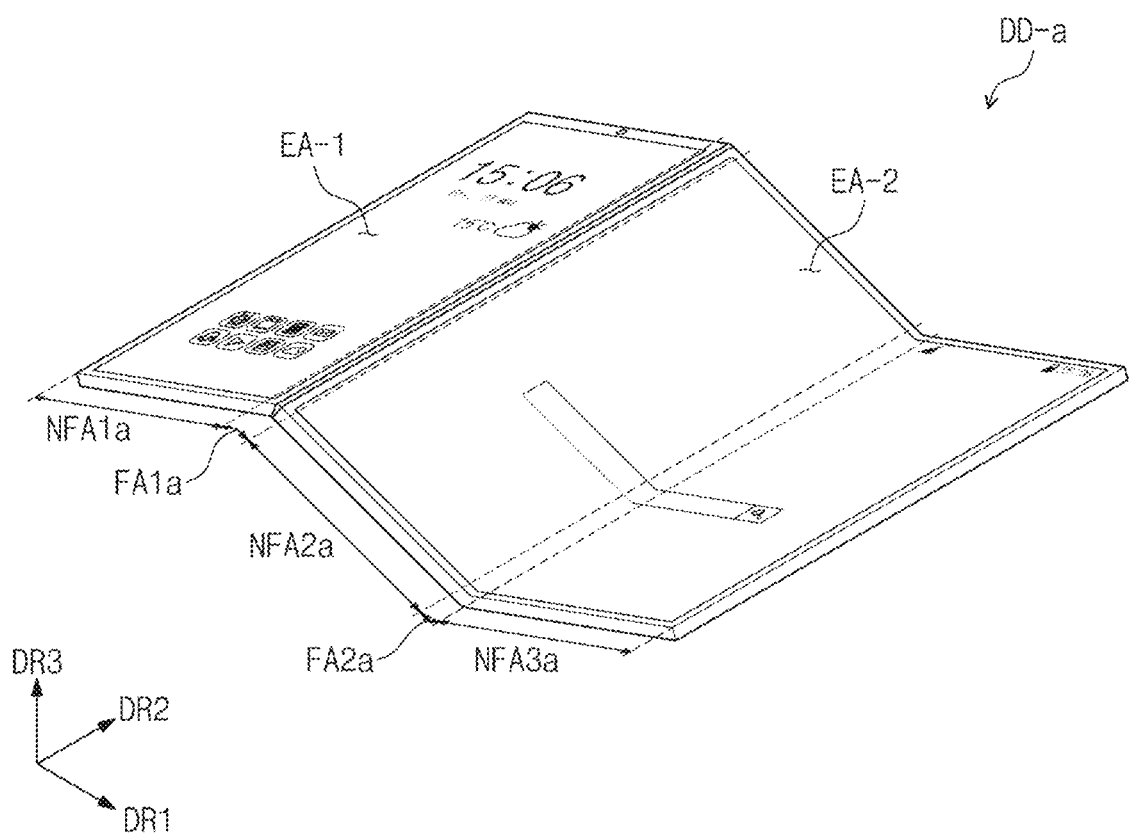
FIG. 2B is a perspective view illustrating a display device according to an embodiment of the present invention.

FIG. 2A is a perspective view illustrating a display device according to another embodiment of the present invention. FIG. 2B is a perspective view illustrating a state before the display device illustrated in FIG. 2A is folded.

Referring to FIGS. 2A and 2B, a display device DD-a may include two folding regions FA1a and FA2a and three non-folding regions NFA1a, NFA2a, and NFA3a.

The display device DD-a may display an image through a first active region EA-1 and a second active region EA-2. FIG. 2B exemplarily illustrates that the first active region EA-1 and the second active region EA-2 are not continuous, but the embodiment of the present invention is not limited thereto. In another embodiment, for example, in an embodiment, the first active region EA-1 and the second active region EA-2 may be continuous to each other.

The boundary of the first active region EA-1 and the second active region EA-2 may overlap a first folding region FA1a in a plan view, and a second folding region FA2a may be defined in the second active region EA-2. The first folding region FA1a may be outer-folded and the second folding region FA2a may be inner-folded.

FIGS. 1A to 2B illustrate that the display devices DD and DD-a of embodiments are foldable display devices, but the embodiment of the present invention is not limited thereto.

The display device according to an embodiment may be a flexible display device which may be folded or bent or may be maintained in a folded state or bent state. In the specification, the term "flexible" means bendable characteristics, and is not limited to a structure that is bent and fully folded, but may include a structure that is bent up to a level of several nanometers (nm).

Figure 3:
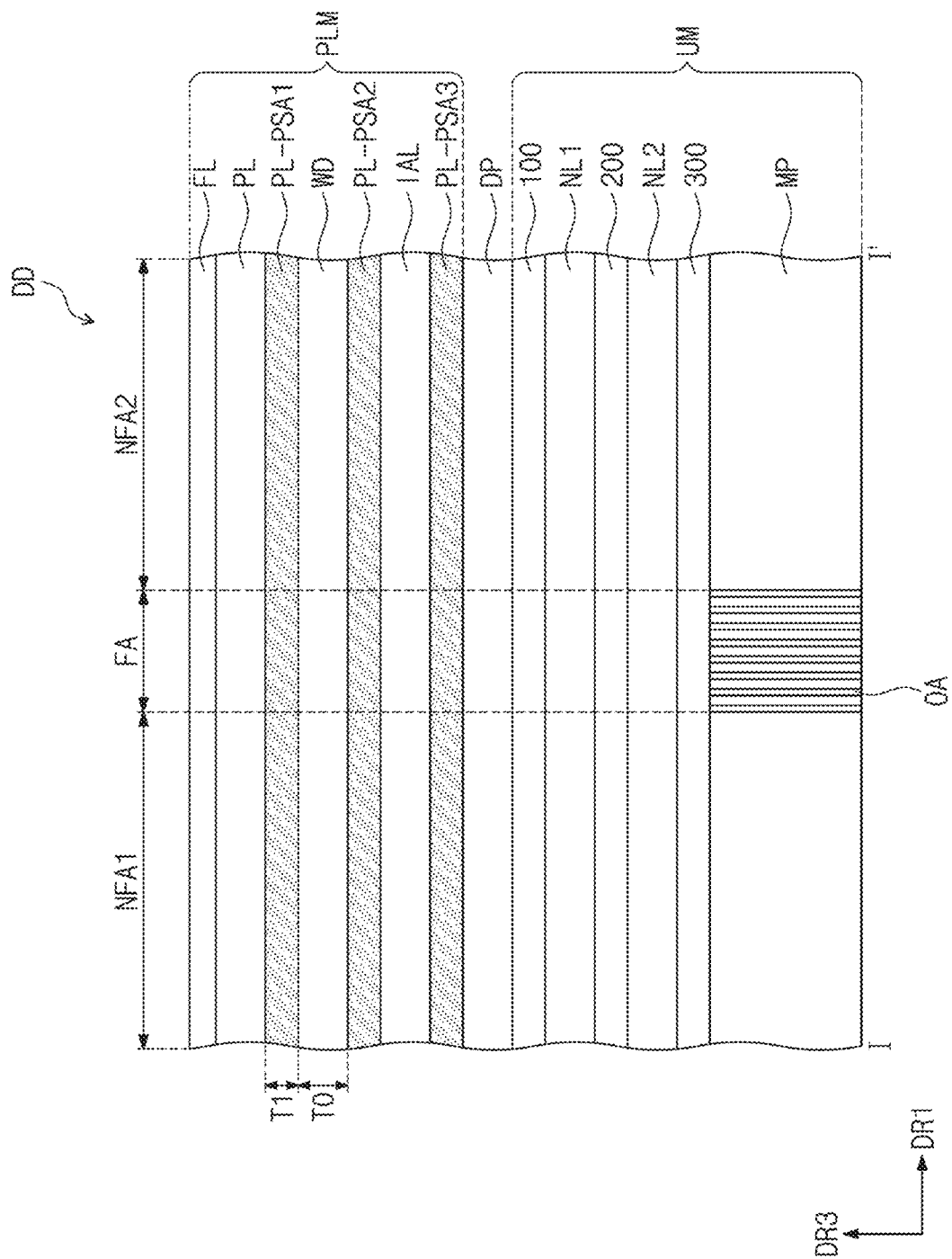
FIG. 3 is a cross-sectional view illustrating a portion taken along line I-I' of FIG. 1A.

FIG. 3 is a cross-sectional view illustrating a portion taken along line I-I' of FIG. 1A. The display device DD of an embodiment may include a display panel DP and a protective member PLM disposed on the display panel DP. The protective member PLM may include a window WD disposed on the display panel DP, a protective layer PL disposed on the window WD, a first protective adhesive layer PL-PSA1 disposed between the window WD and the protective layer PL, and a second protective adhesive layer PL-PSA2 disposed between the display panel DP and the window WD. In addition, the protective member PLM may further include an impact absorbing layer IAL and a third protective adhesive layer PL-PSA3. Hereinafter, the description of the protective member PLM may be applied to the display devices DD and DD-a of FIGS. 1A to 2B.

The first protective adhesive layer PL-PSA1, the second protective adhesive layer PL-PSA2, and the third protective adhesive layer PL-PSA3 may each include a pressure sensitive adhesive ("PSA"). The protective adhesive layers PL-PSA1, PL-PSA2, and PL-PSA3 will be described later in more detail.

The display panel DP may be an organic light emitting display panel, an inorganic light emitting display panel, a quantum dot display panel, a micro LED display panel, a nano LED display panel, or a liquid crystal display panel. The display panel DP may be folded with respect to at least one folding axis FX.

The window WM may include a glass substrate. The window WM may include tempered glass. The thickness TO of the window WD may be about 10 μm to about 300 μm. More specifically, the thickness TO of the window WD may be about 30 μm to about 80 μm. However, this is exemplary, and the thickness TO of the window WD is not limited thereto.

The protective layer PL may transmit an image, as it is, provided from the display panel DP, and may protect the window WD against an external impact. In an embodiment, for example, the protective layer PL may include at least one of polyethylene terephthalate (PET), polyethylene naphthalate (PEN), polyether sulfone (PES), polyimide (PI), polyarylate (PAR), polycarbonate (PC), polymethyl methacrylate (PMMA), or cyclic olefin copolymer (COC).

The protective member PLM may further include a functional layer FL disposed on the protective layer PL. The functional layer FL may include a single layer or multilayer structure. The functional layer FL may include at least one of an anti-fingerprint layer or a hard coating layer.

According to an embodiment, the first protective adhesive layer PL-PSA1 may be disposed between the window WD and the protective layer PL. The first protective adhesive layer PL-PSA1 may combine the window WD and the protective layer PL (i.e., attach the window WD to the protective layer PL). The first protective adhesive layer PL-PSA1 may have a storage modulus of about 2 MPa to about 8 MPa at frequencies of about 20,000 Hz to about 100,000 Hz and a temperature of about 25° C. In the specification, the frequencies of about 20,000 Hz to about 100,000 Hz may be frequencies corresponding to the case where an external impact is applied to the display device DD, and may be frequencies under the condition that the first protective adhesive layer PL-PSA1, the second protective adhesive layer PL-PSA2, and the third protective adhesive layer PL-PSA3 exhibit high-speed behaviors. The frequencies of about 20,000 Hz to about 100,000 Hz may be frequencies under the condition that the adhesive layer having viscoelasticity properties exhibits a high-speed behavior.

In the specification, the storage modulus of the first protective adhesive layer PL-PSA1, and the loss factors of the second protective adhesive layer PL-PSA2 and the third protective adhesive layer PL-PSA3 are measured with a rheometer (e.g., TA instruments). Samples for measuring physical properties were prepared by processing each of the first protective adhesive layer PL-PSA1, the second protective adhesive layer PL-PSA2, and the third protective adhesive layer PL-PSA3 into a cylindrical shape having a thickness of about 500 μm. Frequencies were changed with a strain of 1 percentage (%) in the rheometer to measure the storage modulus of the first protective adhesive layer PL-PSA1 and the loss factor of each of the second protective adhesive layer PL-PSA2 and the third protective adhesive layer PL-PSA3.

The first protective adhesive layer PL-PSA1 having a storage modulus of about 2 MPa to about 8 MPa at frequencies of about 20,000 Hz to about 100,000 Hz and a temperature of about 25° C. may protect, from an external impact, the window WD disposed below the first protective adhesive layer PL-PSA1. The frequencies of about 20,000 Hz to about 100,000 Hz may be frequencies corresponding to the case where an external impact is applied to the display device DD, and may be frequencies under the condition that the first protective adhesive layer PL-PSA1 exhibits a high-speed behavior.

The first protective adhesive layer having a storage modulus of less than about 2 MPa at frequencies of about 20,000 Hz to about 100,000 Hz may be damaged by the external impact. The first protective adhesive layer having a storage modulus of greater than about 8 MPa at frequencies of about 20,000 Hz to about 100,000 Hz may be peeled off upon repeated folding and unfolding of the display device. Thus, the display device DD including the first protective adhesive layer PL-PSA1 having a storage modulus of about 2 MPa to about 8 MPa at frequencies of about 20,000 Hz to about 100,000 Hz and a temperature of about 25° C. may exhibit characteristics in which the impact resistance and folding reliability are excellent.

The first protective adhesive layer PL-PSA1 may have a storage modulus of about 0.3 MPa or less at a temperature of about −20° C. and a frequency of about 1 Hz. The first protective adhesive layer PL-PSA1 may have a storage modulus of about 0.05 MPa or less at a temperature of about 25° C. and a frequency of about 1 Hz. The frequency of 1 Hz may be a frequency corresponding to an external force applied to the display device DD in order to fold and unfold the display device DD. The first protective adhesive layer having a storage modulus of greater than about 0.3 MPa at a temperature of about −20° C. and a frequency of about 1 Hz may be peeled off from the display device upon repeated folding and unfolding. In addition, the first protective adhesive layer having a storage modulus of greater than about 0.05 MPa at a temperature of about 25° C. and a frequency of about 1 Hz may not be easily repeatedly folded and unfolded. Accordingly, the first protective adhesive layer PL-PSA1 having a storage modulus of about 0.3 MPa or less at a temperature of about −20° C. and a frequency of about 1 Hz and having a storage modulus of about 0.05 MPa or less at a temperature of about 25° C. and a frequency of about 1 Hz may maintain reliability upon repeated folding and unfolding.

The thickness T1 of the first protective adhesive layer PL-PSA1 may be about 25 μm to about 65 μm. The first protective adhesive layer having a thickness of less than about 25 μm may be damaged from an external impact or may not absorb the external impact, thereby causing damage to components disposed below the first protective adhesive layer. The first protective adhesive layer having a thickness of greater than about 65 μm may not be easily repeatedly folded and unfolded. The first protective adhesive layer PL-PSA1 having a thickness of about 25 μm to about 65 μm may protect, from an external impact, the window WD disposed below the first protective adhesive layer PL-PSA1. Thus, the display device DD including the first protective adhesive layer PL-PSA1 having a thickness of about 25 μm to about 65 μm may exhibit characteristics in which the impact resistance and folding reliability are improved.

The second protective adhesive layer PL-PSA2 may combine the window WD and the impact absorbing layer IAL. The second protective adhesive layer PL-PSA2 may have a first loss factor (tan δ) of about 1.6 to about 2.5 at frequencies of about 20,000 Hz to about 100,000 Hz and a temperature of about 25° C. The second protective adhesive layer PL-PSA2 having a first loss factor (tan δ) of about 1.6 to about 2.5 at frequencies of about 20,000 Hz to about 100,000 Hz and a temperature of about 25° C. may protect, from an external impact, the display panel DP, etc. disposed below the second protective adhesive layer PL-PSA2. The frequencies of about 20,000 Hz to about 100,000 Hz may be frequencies corresponding to the case where an external impact is applied to the display device DD, and may be frequencies under the condition that the second protective adhesive layer PL-PSA2 exhibits a high-speed behavior.

The loss factor (tan δ) may be a value that a loss modulus is divided by a storage modulus. The second protective adhesive layer having a first loss factor of less than about 1.6 at frequencies of about 20,000 Hz to about 100,000 Hz may be vulnerable to the external impact. The second protective adhesive layer having a first loss factor of greater than about 2.5 at frequencies of about 20,000 Hz to about 100,000 Hz may be peeled off upon repeated folding and unfolding. Thus, in an embodiment, the display device DD including the second protective adhesive layer PL-PSA2 having a first loss factor (tan δ) of about 1.6 to about 2.5 at frequencies of about 20,000 Hz to about 100,000 Hz and a temperature of about 25° C. may exhibit characteristics in which the impact resistance and folding reliability are excellent.

The second protective adhesive layer PL-PSA2 may have a storage modulus of about 0.3 MPa or less at a temperature of about −20° C. and a frequency of about 1 Hz. The second protective adhesive layer PL-PSA2 may have a storage modulus of about 0.05 MPa or less at a temperature of about 25° C. and a frequency of about 1 Hz. The second protective adhesive layer having a storage modulus of greater than about 0.3 MPa at a temperature of about −20° C. and a frequency of about 1 Hz may be peeled off from the display device upon repeated folding and unfolding. In addition, the second protective adhesive layer having a storage modulus of greater than about 0.05 MPa at a temperature of about 25° C. and a frequency of about 1 Hz may not be easily repeatedly folded and unfolded. Accordingly, the second protective adhesive layer PL-PSA2 having a storage modulus of about 0.3 MPa or less at a temperature of about-20° C. and a frequency of about 1 Hz and having a storage modulus of about 0.05 MPa or less at a temperature of about 25° C. and a frequency of about 1 Hz may maintain reliability upon repeated folding and unfolding.

Each of the first protective adhesive layer PL-PSA1 and the second protective adhesive layer PL-PSA2 may include a thermosetting resin or a photocurable resin. In an embodiment, for example, at least one of the first protective adhesive layer PL-PSA1 or the second protective adhesive layer PL-PSA2 may include a thermosetting resin, and the thermosetting resin may be cured by heat of about 100° C. to about 140° C. Alternatively, at least one of the first protective adhesive layer PL-PSAL or the second protective adhesive layer PL-PSA2 may include a photocurable resin, and the photocurable resin may be cured by light in a wavelength range of about 200 nm to about 400 nm or in a wavelength range of about 400 nm to about 800 nm. The photocurable resin may include a photoinitiator.

Each of the first protective adhesive layer PL-PSAL and the second protective adhesive layer PL-PSA2 may include an acrylate-based monomer. In an embodiment, for example, each of the first protective adhesive layer PL-PSAL and the second protective adhesive layer PL-PSA2 may include at least one of ethyl acrylate, n-butyl acrylate, t-butylacrylate, iso-butylacrylate, n-hexylacrylate, 2-ethylhexyl acrylate, n-octyl acrylate, isooctyl acrylate, n-nonyl acrylate, iso-nonyl acrylate, n-decyl acrylate, iso-decyl acrylate, n-dodecyl acrylate, n-tridecyl acrylate, n-tetradecyl acrylate, 2(2-ethoxyethoxy)ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxylauryl acrylate, or [4-(hydroxymethyl)cyclohexyl]methyl acrylate.

The display device DD of an embodiment may include a protective member PLM disposed on the display panel DP. The protective member PLM may include the second protective adhesive layer PL-PSA2, the window WD, the first protective adhesive layer PL-PSA1, and the protective layer PL, which are sequentially stacked. The first protective adhesive layer PL-PSA1 may have a storage modulus of about 2 MPa to about 8 MPa at frequencies of about 20,000 Hz to about 100,000 Hz and a temperature of about 25° C. The second protective adhesive layer PL-PSA2 may have a first loss factor of about 1.6 to about 2.5 at frequencies of about 20,000 Hz to about 100,000 Hz and a temperature of about 25° C. The first protective adhesive layer PL-PSAL having a storage modulus of about 2 MPa to about 8 MPa at frequencies of about 20,000 Hz to about 100,000 Hz and a temperature of about 25° C. may prevent the window WD from being damaged by the external impact, and the second protective adhesive layer PL-PSA2 having a first loss factor (tan δ) of about 1.6 to about 2.5 at frequencies of about 20,000 Hz to about 100,000 Hz and a temperature of about 25° C. may minimize the damage of the display panel DP by the external impact. Thus, the display device DD including the first protective adhesive layer PL-PSAL and the second protective adhesive layer PL-PSA2 of an embodiment may exhibit characteristics in which the impact resistance and folding reliability are excellent.

The protective member PLM may further include the third protective adhesive layer PL-PSA3 and the impact absorbing layer IAL which are sequentially stacked between the display panel DP and the second protective adhesive layer PL-PSA2. The third protective adhesive layer PL-PSA3 may combine the display panel DP and the impact absorbing layer IAL.

The impact absorbing layer IAL may be a stretched film including an optical function. The impact absorbing layer IAL may be an optical axis control film. The impact absorbing layer IAL may include a polymer resin. In an embodiment, for example, the impact absorbing layer IAL may include a resin such as polyimide (PI) or polyethyleneterephthalate (PET), and have flexibility.

The third protective adhesive layer PL-PSA3 may have a second loss factor (tan δ) of about 1.6 to about 2.5 at frequencies of about 20,000 Hz to about 100,000 Hz and a temperature of about 25° C. The third protective adhesive layer having a second loss factor at a frequency of about 20,000 Hz to about 100,000 Hz and a temperature of about 25° C. may be vulnerable to the external impact. The third protective adhesive layer having a second loss factor of greater than about 2.5 at frequencies of about 20,000 Hz to about 100,000 Hz may be peeled off upon repeated folding and unfolding.

The third protective adhesive layer PL-PSA3 may be the same as or different from the second protective adhesive layer PL-PSA2. More specifically, the second loss factor (tan δ) of the third protective adhesive layer PL-PSA3 may be the same as or different from the first loss factor (tan δ) of the second protective adhesive layer PL-PSA2.

The third protective adhesive layer PL-PSA3 may have a storage modulus of about 0.3 MPa or less at a temperature of about −20° C. and a frequency of about 1 Hz. The third protective adhesive layer PL-PSA3 may have a storage modulus of about 0.05 MPa or less at a temperature of about 25° C. and a frequency of about 1 Hz. The third protective adhesive layer having a storage modulus of greater than about 0.3 MPa at a temperature of about −20° C. and a frequency of about 1 Hz may be peeled off from the display device upon repeated folding and unfolding. In addition, the third protective adhesive layer having a storage modulus of greater than about 0.05 MPa at a temperature of about 25° C. and a frequency of about 1 Hz may not be easily repeatedly folded and unfolded. Accordingly, the third protective adhesive layer PL-PSA3 having a storage modulus of about 0.3 MPa or less at a temperature of about −20° C. and a frequency of about 1 Hz and having a storage modulus of about 0.05 MPa or less at a temperature of about 25° C. and a frequency of about 1 Hz may maintain reliability upon repeated folding and unfolding.

The third protective adhesive layer PL-PSA3 may include a thermosetting resin or a photocurable resin. In an embodiment, for example, the third protective adhesive layer PL-PSA3 may include a thermosetting resin, and the thermosetting resin may be cured by heat of about 100° C. to about 140° C. Alternatively, the third protective adhesive layer PL-PSA3 may include a photocurable resin, and the photocurable resin may be cured by light in a wavelength range of about 200 nm to about 400 nm or in a wavelength range of about 400 nm to about 800 nm. The photocurable resin may include a photoinitiator.

The third protective adhesive layer PL-PSA3 may include an acrylate-based monomer. In an embodiment, for example, the third protective adhesive layer PL-PSA3 may include at least one of ethyl acrylate, n-butyl acrylate, t-butylacrylate, iso-butylacrylate, n-hexylacrylate, 2-ethylhexyl acrylate, n-octyl acrylate, isooctyl acrylate, n-nonyl acrylate, iso-nonyl acrylate, n-decyl acrylate, iso-decyl acrylate, n-dodecyl acrylate, n-tridecyl acrylate, n-tetradecyl acrylate, 2(2-ethoxyethoxy)ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxylauryl acrylate, or [4-(hydroxymethyl)cyclohexyl]methyl acrylate.

The display device DD may further include a lower member UM disposed below the display panel DP. The lower member UM may include a support plate MP, a second functional layer NL2, and a first functional layer NL1, which are sequentially stacked. In addition, the lower member UM may include a third lower adhesive layer 300 disposed between the support plate MP and the second functional layer NL2, a second lower adhesive layer 200 disposed between the second functional layer NL2 and the first functional layer NL1, and a first lower adhesive layer 100 disposed between the first functional layer NL1 and the display panel DP.

The support plate MP may provide an opening OA defined therein and corresponding to the folding region FA. In the display device DD-a including at least two folding regions FA1a and FA2a, a first opening that does not overlap the non-folding regions NFA1a, NFA2a, and NFA3a and but overlaps the first folding region FA1a, and a second opening that does not overlap the non-folding regions NFA1a, NFA2a, and NFA3a and but overlaps the second folding region FA2a in a plan view may be defined.

The support plate MP in which the opening OA is defined may exhibit characteristics in which folding and unfolding is easily repeated. The support plate MP may include a metal alloy. Although not illustrated in the drawings, below the support plate MP, a heat dissipation sheet, an insulating film, a cushion layer, etc. may be disposed.

The second functional layer NL2 may improve an impact resistance of the display device DD. The second functional layer NL2 may include a single layer or multilayer structure. The second functional layer NL2 may include at least one of a barrier film or a cushion layer. When the second functional layer NL2 includes the barrier film, the barrier film may include a synthetic resin film. When the second functional layer NL2 includes the cushion layer, the cushion layer may include foam or sponge.

The first functional layer NL1 may prevent the display panel DP from being damaged during a manufacture process. The first functional Layer NL1 may be a colored polyimide film. In an embodiment, for example, the first functional layer NL1 may be an opaque yellow film, but the embodiment of the present invention is not limited thereto.

The support plate MP and the second functional layer NL2 may be combined by the third lower adhesive layer 300. The second functional layer NL2 and the first functional layer NL1 may be combined by the second lower adhesive layer 200. The first functional layer NL1 and the display panel DP may be combined by the first lower adhesive layer 100.

Each of the first lower adhesive layer 100, the second lower adhesive layer 200, and the third lower adhesive layer 300 may include a typical adhesive or a gluing agent. Each of the first lower adhesive layer 100, the second lower adhesive layer 200, and the third lower adhesive layer 300 may include a pressure sensitive adhesive (PSA), an optically clear adhesive film, an optically clear adhesive resin, etc.

Figure 4:
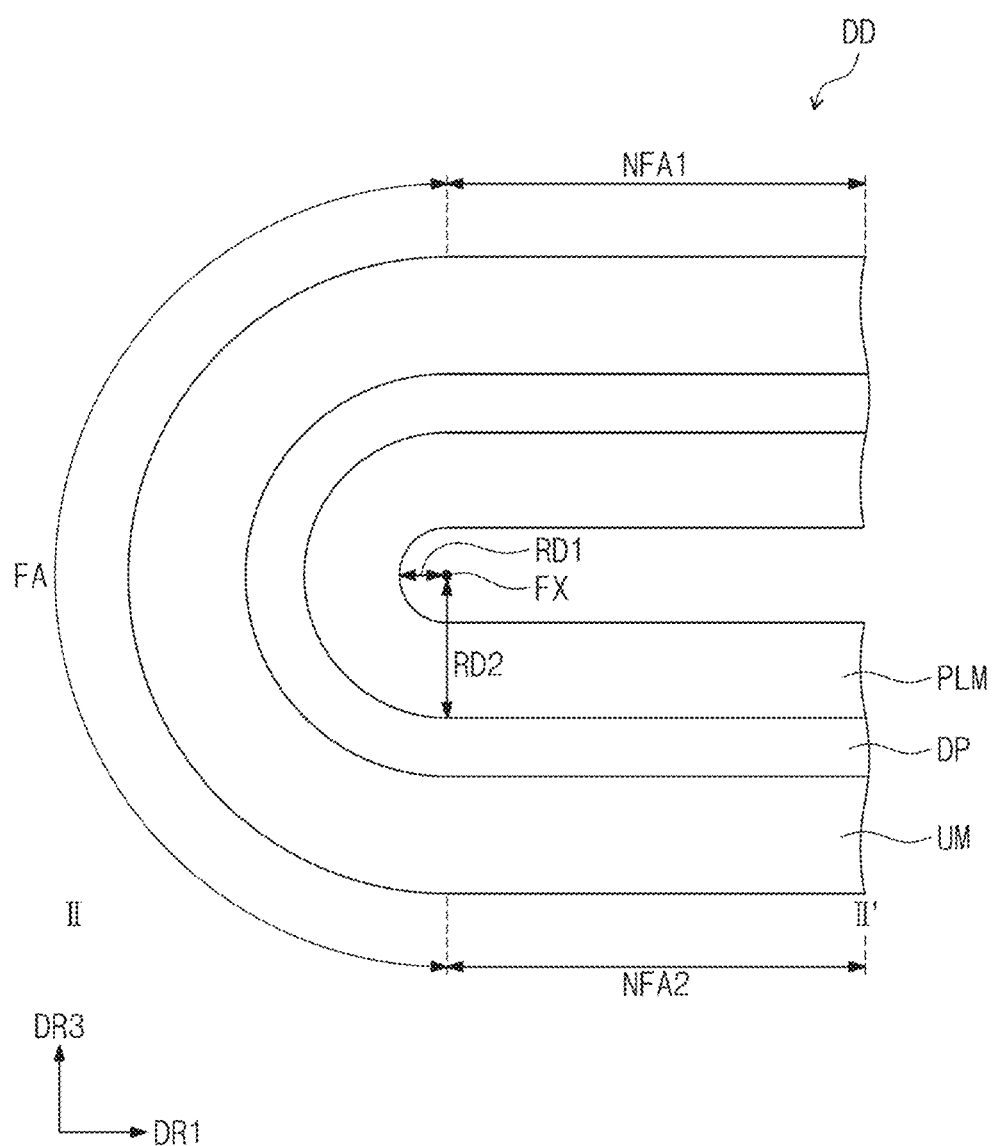
FIG. 4 is a cross-sectional view illustrating a portion taken along line II-II' of FIG. 1B.

FIG. 4 is a cross-sectional view illustrating a portion taken along line II-II' of FIG. 1B. Referring to FIG. 4, the display panel DP and the protective member PLM may be folded with respect to the folding axis FX. In addition, the lower member UM may be folded with respect to the folding axis FX. In an embodiment, for example, when the protective member PLM is folded, the radius of curvature RD1 of the protective member PLM may be about 1 mm to about 5 mm. When the display panel DP is folded, the radius of curvature RD2 of the display panel DP may be about 1 mm to about 5 mm. The radius of curvature RD2 of the display panel DP may be greater than the radius of curvature RD1 of the protective member PLM.

Hereinafter, with reference to Examples and Comparative Examples, a display device including an adhesive member according to an embodiment of the present invention will be described in detail. In addition, Examples described below are only illustrations to assist the understanding of the present invention, and the scope of the present invention is not limited thereto.

EXAMPLES

Storage moduli of Adhesive layers A to D are listed in Table 1. The storage moduli of Adhesive layers A to D, which are measured at a frequency of about 1 Hz and temperatures of about −20° C., about 25° C., about 60° C., and about 85° C., are listed in Table 1.

TABLE 1

| Division | −20° C. | 25° C. | 60° C. | 85° C. |
|---|---|---|---|---|
| Adhesive layer D | 0.202 MPa | 0.033 MPa | 0.024 MPa | 0.021 MPa |
| Adhesive layer C | 0.128 MPa | 0.045 MPa | 0.039 MPa | 0.037 MPa |
| Adhesive layer B | 0.106 MPa | 0.031 MPa | 0.019 MPa | 0.016 MPa |
| Adhesive layer A | 0.072 MPa | 0.027 MPa | 0.020 MPa | 0.018 MPa |

Referring to Table 1, Adhesive layers A to D have a storage modulus of about 0.202 MPa or less at a frequency of about 1 Hz and a temperature of about −20° C. In addition, Adhesive layers A to D have a storage modulus of about 0.045 MPa or less at a frequency of about 1 Hz and a temperature of about 25° C. Accordingly, it is believed that Adhesive layers A to D may maintain reliability upon repeated folding and unfolding.

Figure 5:
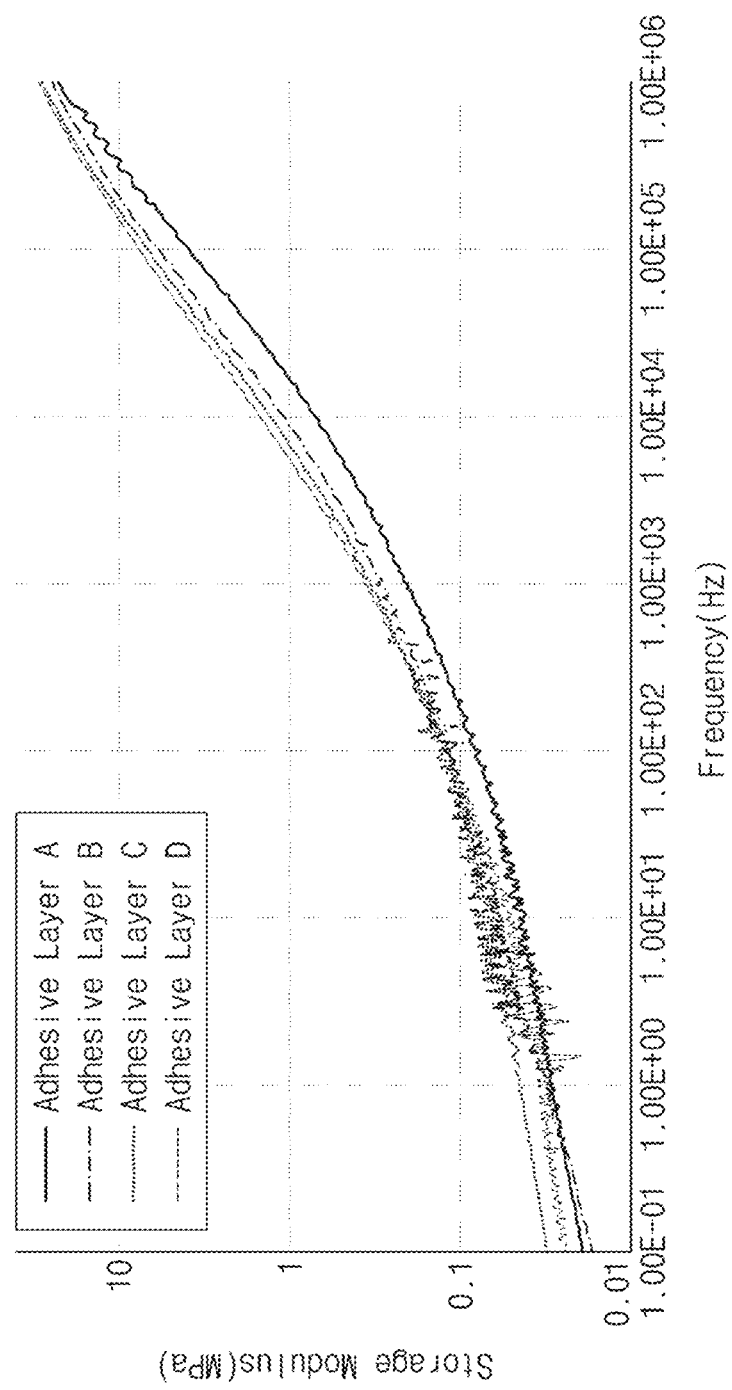
FIG. 5 is a graph showing a storage modulus of an adhesive layer versus a change in frequency.

FIG. 5 is a graph showing storage moduli of Adhesive layers A to D versus a change in frequency at a temperature of about 25° C. The storage modulus values shown in FIG. 5 are listed in more detail in Table 2.

TABLE 2

| Division | 1 Hz | 10 Hz | 100 Hz | 1000 Hz | 10000 Hz |
|---|---|---|---|---|---|
| Adhesive layer D | 0.03 MPa | 0.05 MPa | 0.12 MPa | 0.37 MPa | 1.53 MPa |
| Adhesive layer C | 0.05 MPa | 0.07 MPa | 0.13 MPa | 0.33 MPa | 1.31 MPa |
| Adhesive layer B | 0.03 MPa | 0.06 MPa | 0.13 MPa | 0.28 MPa | 1.11 MPa |
| Adhesive layer A | 0.03 MPa | 0.05 MPa | 0.08 MPa | 0.21 MPa | 0.71 MPa |
| Division | 20000 Hz | 30000 Hz | 40000 Hz | 50000 Hz | 100000 Hz |
| Adhesive layer D | 2.53 MPa | 3.35 MPa | 3.74 MPa | 4.65 MPa | 7.90 MPa |
| Adhesive layer C | 2.20 MPa | 2.86 MPa | 3.66 MPa | 4.21 MPa | 7.25 MPa |
| Adhesive layer B | 1.84 MPa | 2.45 MPa | 3.02 MPa | 3.59 MPa | 5.93 MPa |
| Adhesive layer A | 1.14 MPa | 1.53 MPa | 1.89 MPa | 2.24 MPa | 3.83 MPa |

Referring to Table 2, Adhesive layers C and D exhibit a storage modulus of about 2 MPa to about 8 MPa at a temperature of about 25° C. and frequencies of about 20,000 Hz to about 100,000 Hz. Adhesive layer B exhibits a storage modulus of less than about 2 MPa at a temperature of 25° C. and a frequency of about 20,000 Hz. Adhesive layer A exhibits a storage modulus of about 2 MPa or less at a temperature of about 25° C. and frequencies of about 20,000 Hz to about 40,000 Hz. At a temperature of about 25° C. and frequencies of about 20,000 Hz to about 100,000 Hz, Adhesive layers C and D each have a higher storage modulus than each of Adhesive layers A and B. Adhesive layers C and D satisfy a storage modulus range of the first protective adhesive layer according to an embodiment.

Evaluation results of impact resistance characteristics in display devices of Comparative Examples and Examples are listed in Table 3. "Pen drop" refers to a minimum height (unit: centimeters (cm)) from which a defect of the display device is caused by dropping a pen having a diameter of about 0.3 Ø (pi) onto the display device. The minimum and average values of the height where a defect of the display device is caused by performing the pen drop ten times are listed in Table 3.

The display devices of Comparative Examples 1-1 and 1-2 and Experimental Examples 1-1 and 1-2 in Table 3 may have a structure in which the display device DD in FIG. 3 further includes an auxiliary adhesive layer and a cushion layer disposed below the support plate MP. The display device of Comparative Example 1-1 includes Adhesive layer A between the window and the protective layer, and the display device of Comparative Example 1-2 includes Adhesive layer B between the window and the protective layer. The display device of Experimental Example 1-1 includes Adhesive layer C between the window and the protective layer, and the display device of Experimental Example 1-2 includes Adhesive layer D between the window and the protective layer. The display devices of Comparative Examples 1-1 and 1-2 and Experimental Examples 1-1 and 1-2 include the same configurations except for the adhesive layer disposed between the window and the protective layer.

TABLE 3

| Pen drop | Comparative Example 1-1 Adhesive layer A | Comparative Example 1-2 Adhesive layer B | Experimental Example 1-1 Adhesive layer C | Experimental Example 1-2 Adhesive layer D |
|---|---|---|---|---|
| Average value | 11 cm | 11 cm | 13 cm | 14 cm |
| Minimum value | 11.8 cm | 11.8 cm | 13.6 cm | 14.2 cm |

Referring to Table 3, it may be seen that the display devices of Experimental Examples 1-1 and 1-2 have an impact resistance superior to the display devices of Comparative Examples 1-1 and 1-2. The display devices of Experimental Examples 1-1 and 1-2 include Adhesive layer C or D, and Adhesive layers C and D have a storage modulus of about 2 MPa to about 8 MPa at frequencies of about 20,000 Hz to about 100,000 Hz and a temperature of about 25° C. Thus, the display device including the first protective adhesive layer which has a storage modulus of about 2 MPa to about 8 MPa at frequencies of about 20,000 Hz to about 100,000 Hz and a temperature of about 25° C. and is disposed between the window and the protective layer may exhibit characteristics in which the impact resistance is excellent.

The display devices of Comparative Examples 1-1 and 1-2 include Adhesive layer A or B, and Adhesive layers A and B have a lower storage modulus, at frequencies of about 20,000 Hz to about 100,000 Hz and a temperature of about 25° C., than Adhesive layers C and D.

Storage moduli of Adhesive layers E to G are listed in Table 4. The storage moduli of Adhesive layers E to G, which are measured at a frequency of about 1 Hz and temperatures of about −20° C., about 25° C., about 60° C., and about 85° C., are listed in Table 4.

TABLE 4

| Division | −20° C. | 25° C. | 60° C. | 85° C. |
|---|---|---|---|---|
| Adhesive layer G | 0.150 MPa | 0.048 MPa | 0.034 MPa | 0.028 MPa |
| Adhesive layer F | 0.072 MPa | 0.027 MPa | 0.020 MPa | 0.018 MPa |
| Adhesive layer E | 0.202 MPa | 0.033 MPa | 0.024 MPa | 0.021 MPa |

Referring to Table 4, Adhesive layers E to G have a storage modulus of about 0.202 MPa or less at a frequency of about 1 Hz and a temperature of about −20° C. In addition, Adhesive layers E to G have a storage modulus of about 0.045 MPa or less at a frequency of about 1 Hz and a temperature of about 25° C. Accordingly, it is believed that Adhesive layers E to G may maintain reliability upon repeated folding and unfolding.

Figure 6:
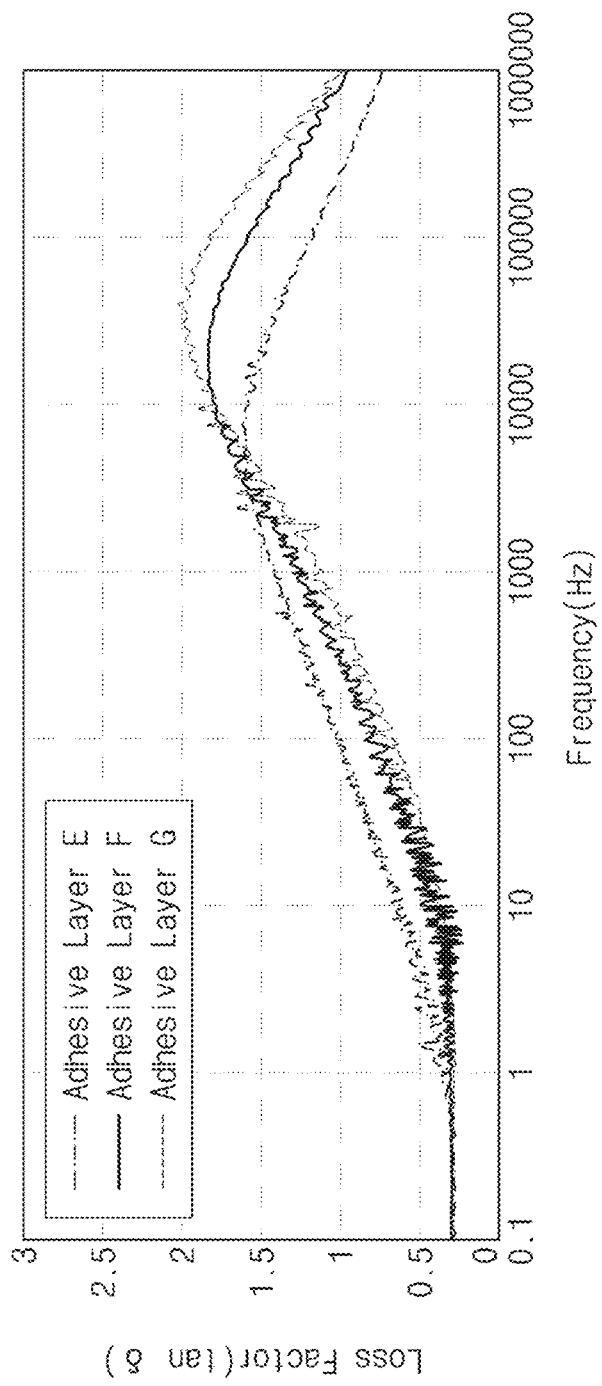
FIG. 6 is a graph showing a loss factor of an adhesive layer versus a change in frequency.

FIG. 6 is a graph showing loss factors of Adhesive layers E to G versus a change in frequency at a temperature of about 25° C. The loss factor values shown in FIG. 6 are listed in more detail in Table 5.

TABLE 5

| Division | 1 Hz | 10 Hz | 100 Hz | 1000 Hz | 10000 Hz |
|---|---|---|---|---|---|
| Adhesive layer G | 0.29 | 0.35 | 0.68 | 1.11 | 1.81 |
| Adhesive layer F | 0.31 | 0.40 | 0.83 | 1.28 | 1.80 |
| Adhesive layer E | 0.35 | 0.60 | 1.04 | 1.42 | 1.58 |
| Division | 20000 Hz | 30000 Hz | 40000 Hz | 50000 Hz | 100000 Hz |
| Adhesive layer G | 1.96 | 1.99 | 2.03 | 2.00 | 1.84 |
| Adhesive layer F | 1.83 | 1.82 | 1.78 | 1.75 | 1.60 |
| Adhesive layer E | 1.47 | 1.43 | 1.36 | 1.38 | 1.17 |

Referring to Table 5, it may be seen that Adhesive layer E has a loss factor of about 1.5 or less at a temperature of about 25° C. and frequencies of about 20,000 Hz to about 100,000 Hz. It may be seen that Adhesive layers G and F has a loss factor of about 1.6 to about 2.5 at a temperature of about 25° C. and frequencies of about 20,000 Hz to about 100,000 Hz. Adhesive layers G and F may each correspond to at least one of the second protective adhesive layer or the third protective adhesive layer according to an embodiment.

Evaluation results of impact resistance characteristics in display devices of Comparative Examples and Examples are listed in Table 6. "Pen drop" refers to measuring a height where a defect of the display device is caused by dropping a pen having a diameter of about 0.3 @ (pi) onto the display device.

The display devices of Comparative Example 2, and Experimental Examples 2-1 and 2-2 include the same configurations except for the adhesive layer disposed between the display panel and the impact absorbing layer, and the adhesive layer disposed between the impact absorbing layer and the window. The display devices of Comparative Example 2, and Experimental Examples 2-1 and 2-2 may have a structure in which the display device DD in FIG. 3 further includes the auxiliary adhesive layer and the cushion layer disposed below the support plate MP. The display device of Comparative Example 2 includes Adhesive layer E between the display panel and the impact absorbing layer and between the impact absorbing layer and the window. The display device of Experimental Example 2-1 includes Adhesive layer F between the display panel and the impact absorbing layer and between the impact absorbing layer and the window. The display device of Experimental Example 2-2 includes Adhesive layer G between the display panel and the impact absorbing layer and between the impact absorbing layer and the window.

TABLE 6

| Pen drop | Comparative Example 2 Adhesive layer E | Experimental Example 2-1 Adhesive layer F | Experimental Example 2-2 Adhesive layer G |
|---|---|---|---|
| Average value | 9 cm | 11 cm | 12 cm |
| Minimum value | 9.4 cm | 11.8 cm | 12.6 cm |

Referring to Table 6, it may be seen that the display devices of Experimental Examples 2-1 and 2-2 have an impact resistance superior to the display device of Comparative Example 2. The display devices of Experimental Examples 2-1 and 2-2 include Adhesive layer F or G, and Adhesive layers F and G have a loss factor of about 1.6 to about 2.5 at a temperature of about 25° C. and frequencies of about 20,000 Hz to about 100,000 Hz. Thus, in an embodiment, the display device including the second protective adhesive layer and the third protective adhesive layer having a loss factor of about 1.6 to about 2.5 at a temperature of about 25° C. and a frequency of about 20,000 Hz to about 100,000 Hz may have an improvement in impact resistance.

Evaluation results of impact resistance characteristics in display devices of Comparative Examples and Examples are listed in Table 7. "Pen drop" refers to measuring a height where a defect of the display device is caused by dropping a pen having a diameter of about 0.3 @ (pi) onto the display device.

The display device of Comparative Example 3 includes Adhesive layer E between the impact absorbing layer and the window and Adhesive layer E between the display panel and the impact absorbing layer. The display device of Experimental Example 3-1 includes Adhesive layer E between the impact absorbing layer and the window and Adhesive layer F between the display panel and the impact absorbing layer. The display device of Experimental Example 3-2 includes Adhesive layer E between the impact absorbing layer and the window and Adhesive layer G between the display panel and the impact absorbing layer.

The display device of Experimental Example 3-3 includes Adhesive layer F between the impact absorbing layer and the window and Adhesive layer E between the display panel and the impact absorbing layer. The display device of Experimental Example 3-4 includes Adhesive layer F between the impact absorbing layer and the window and Adhesive layer F between the display panel and the impact absorbing layer. The display device of Experimental Example 3-5 includes Adhesive layer F between the impact absorbing layer and the window and Adhesive layer G between the display panel and the impact absorbing layer.

The display device of Experimental Example 3-6 includes Adhesive layer G between the impact absorbing layer and the window and Adhesive layer E between the display panel and the impact absorbing layer. The display device of Experimental Example 3-7 includes Adhesive layer G between the impact absorbing layer and the window and Adhesive layer F between the display panel and the impact absorbing layer. The display device of Experimental Example 3-8 includes Adhesive layer G between the impact absorbing layer and the window and Adhesive layer G between the display panel and the impact absorbing layer.

The display devices of Comparative Example 3 and Experimental Examples 3-1 to 3-8 include the same configurations except for the adhesive layer disposed between the display panel and the impact absorbing layer, and the adhesive layer disposed between the impact absorbing layer and the window. The display devices of Comparative Example 3 and Experimental Examples 3-1 to 3-8 may have a structure in which the display device DD in FIG. 3 further includes the auxiliary adhesive layer and the cushion layer disposed below the support plate MP.

The results of pen drop in Table 7 show an excellent impact resistance in the order of Δ, ▲, ○, ◎, and ◎◎. Among the results of pen drop, "◎◎" represents the best impact resistance, and "Δ" represents the lowest impact resistance.

TABLE 7

| | Comparative Example 3 | Experimental Example 3-1 | Experimental Example 3-2 | Experimental Example 3-3 | Experimental Example 3-4 |
|---|---|---|---|---|---|
| Division | Adhesive layer E Adhesive layer E | Adhesive layer E Adhesive layer F | Adhesive layer E Adhesive layer G | Adhesive layer F Adhesive layer E | Adhesive layer F Adhesive layer F |
| Pen drop | Δ | ▲ | ○ | ▲ | ○ |

| | Experimental Example 3-5 | Experimental Example 3-6 | Experimental Example 3-7 | Experimental Example 3-8 | |
|---|---|---|---|---|---|
| Division | Adhesive layer F Adhesive layer G | Adhesive layer G Adhesive layer E | Adhesive layer G Adhesive layer F | Adhesive layer G Adhesive layer G | — |
| Pen drop | ◎ | ◎ | ◎ | ◎◎ | |

Referring to Table 7, it may be seen that the display devices of Experimental Examples 3-1 to 3-8 including at least one of Adhesive layer G or Adhesive layer F have an improvement in impact resistance as compared with the display device of Comparative Example 3 including Adhesive layer E. In addition, it may be seen that the display device of Experimental Example 3-8 including Adhesive layer G disposed between the display panel and the impact absorbing layer and between the impact absorbing layer and the window has an excellent impact resistance.

The display devices of Experimental Examples 3-1 to 3-8 each include Adhesive layer F or G between the display panel and the impact absorbing layer or between the impact absorbing layer and the window or both between the display panel and the impact absorbing layer and between the impact absorbing layer and the window, and Adhesive layers F and G have a loss factor of about 1.6 to about 2.5 at a temperature of about 25° C. and frequencies of about 20,000 Hz to about 100,000 Hz. Thus, in an embodiment, the display device including the adhesive layer having a loss factor of about 1.6 to about 2.5 at a temperature of about 25° C. and a frequency of about 20,000 Hz to about 100,000 Hz may exhibit characteristics in which the impact resistance and folding reliability are effectively improved.

The display device of Comparative Example 3 includes Adhesive layer E between the display panel and the impact absorbing layer and between the impact absorbing layer and the window, and Adhesive layer E has a loss factor of about 1.5 or less at a temperature of about 25° C. and frequencies of about 20,000 Hz to about 100,000 Hz. Therefore, it is believed that the display device of Comparative Example 3 has an impact resistance lower than the display devices of Experimental Examples 3-1 to 3-8.

The display device of embodiment may include a display panel and a protective member on the display panel. The protective member may include the second protective adhesive layer, the window, the first protective adhesive layer, and the protective layer which are sequentially stacked. The first protective adhesive layer may have a storage modulus of about 2 MPa to about 8 MPa at a temperature of about 25° C. and frequencies of about 20,000 Hz to about 100,000 Hz. The first protective adhesive layer having a storage modulus of about 2 MPa to about 8 MPa at a temperature of about 25° C. and frequencies of about 20,000 Hz to about 100,000 Hz may prevent the window from being damaged by an external impact. The second protective adhesive layer may have a loss factor of about 1.6 to about 2.5 at a temperature of about 25° C. and frequencies of about 20,000 Hz to about 100,000 Hz. The second protective adhesive layer having a loss factor of about 1.6 to about 2.5 at a temperature of about 25° C. and frequencies of about 20,000 Hz to about 100,000 Hz may prevent the display panel from being damaged by an external impact. Thus, the display device including the first protective adhesive layer and the second protective adhesive layer may exhibit characteristics in which the folding reliability and impact resistance are excellent.

In addition, the protective member according to an embodiment may include the third protective adhesive layer and the impact absorbing layer which are sequentially stacked between the display panel and the second protective adhesive layer. The third protective adhesive layer may have a loss factor of about 1.6 to about 2.5 at a temperature of about 25° C. and frequencies of about 20,000 Hz to about 100,000 Hz. Thus, the display device including the third protective adhesive layer may exhibit characteristics in which the folding reliability and impact resistance are effectively improved.

An embodiment of the present invention may provide a display device including an adhesive layer which is disposed on a display panel, and satisfies a storage modulus range or a loss factor range at frequencies of about 20,000 Hz to about 100,000 Hz, thereby having excellent folding reliability and impact resistance.

Although the present invention has been described with reference to a preferred embodiment of the present invention, it will be understood that the present invention should not be limited to these preferred embodiments but various changes and modifications can be made by those skilled in the art without departing from the spirit and scope of the present invention.

Accordingly, the technical scope of the present invention is not intended to be limited to the contents set forth in the detailed description of the specification, but is intended to be defined by the appended claims.

What is claimed is:

1. A display device comprising:
a display panel, which is foldable with respect to at least one folding axis; and
a protective member disposed on the display panel,
wherein the protective member comprises:
a window disposed on the display panel;
a protective layer disposed on the window, wherein the window is disposed between the protective layer and the display panel;
a first protective adhesive layer, which is disposed directly between the window and the protective layer and has a storage modulus of about 2 megapascals (MPa) to about 8 MPa at frequencies of about 20,000 hertz (Hz) to about 100,000 Hz and a temperature of about 25 degrees in Celsius (° C.), wherein the window is disposed between the first protective adhesive layer and the display panel; and
a second protective adhesive layer, which is disposed between the display panel and the window and has a first loss factor (tan δ) of about 1.6 to about 2.5 at frequencies of about 20,000 Hz to about 100,000 Hz and a temperature of about 25° C.,
wherein the protective layer, the first protective adhesive layer, the window, the second protective adhesive layer, and the display panel are arranged in this order, and
wherein the window is disposed directly on the second protective adhesive layer.

2. The display device of claim 1, wherein the protective member further comprises:
an impact absorbing layer disposed between the display panel and the second protective adhesive layer; and
a third protective adhesive layer, which is disposed between the display panel and the impact absorbing layer and has a second loss factor (tan δ) of about 1.6 to about 2.5 at frequencies of about 20,000 Hz to about 100,000 Hz.

3. The display device of claim 2, wherein the second loss factor of the third protective adhesive layer is a value at a temperature of about 25° C.

4. The display device of claim 2, wherein the third protective adhesive layer comprises an acrylate-based monomer.

5. The display device of claim 1, wherein the first protective adhesive layer has a thickness of about 25 micrometers (μm) to about 65 μm.

6. The display device of claim 1, wherein the first protective adhesive layer has a storage modulus of about 0.3 MPa or less at a temperature of about-20° C. and a frequency of about 1 Hz.

7. The display device of claim 1, wherein the first protective adhesive layer has a storage modulus of about 0.05 MPa or less at a temperature of about 25° C. and a frequency of about 1 Hz.

8. The display device of claim 1, wherein the second protective adhesive layer has a storage modulus of about 0.3 MPa or less at a temperature of about-20° C. and a frequency of about 1 Hz.

9. The display device of claim 1, wherein the second protective adhesive layer has a storage modulus of about 0.05 MPa or less at a temperature of about 25° C. and a frequency of about 1 Hz.

10. The display device of claim 1, wherein each of the first protective adhesive layer and the second protective adhesive layer comprises an acrylate-based monomer.

11. The display device of claim 1, wherein each of the first protective adhesive layer and the second protective adhesive layer comprises a thermosetting resin or a photocurable resin.

12. The display device of claim 1, wherein the protective layer comprises at least one of polyethylene terephthalate (PET), polyethylene naphthalate (PEN), polyether sulfone (PES), polyimide (PI), polyarylate (PAR), polycarbonate (PC), polymethyl methacrylate (PMMA), or cyclic olefin copolymer (COC).

13. The display device of claim 1, wherein the protective member further comprises a functional layer disposed on the protective layer, and the functional layer comprises at least one of an anti-fingerprint layer or a hard coating layer.

14. The display device of claim 1, wherein the window comprises a glass substrate.

15. The display device of claim 1, wherein the display panel and the protective member are foldable to have a radius of curvature of about 1 millimeters (mm) to about 5 mm with respect to the at least one folding axis.

16. A display device comprising:
a display panel, which is foldable with respect to at least one folding axis; and
a protective member disposed on the display panel,
wherein the protective member comprises:
an impact absorbing layer disposed on the display panel;
a window disposed on the impact absorbing layer;
a protective layer disposed on the window, wherein the window is disposed between the protective layer and the display panel;
a first protective adhesive layer, which is disposed directly between the window and the protective layer and has a storage modulus of about 2 MPa to about 8 MPa at frequencies of about 20,000 Hz to about 100,000 Hz and a temperature of about 25° C., wherein the window is disposed between the first protective adhesive layer and the display panel;
a second protective adhesive layer, which is disposed between the display panel and the window, and has a first loss factor (tan δ) of about 1.6 to about 2.5 at frequencies of about 20,000 Hz to about 100,000 Hz and a temperature of about 25° C.; and
a third protective adhesive layer, which is disposed between the display panel and the impact absorbing layer and has a second loss factor (tan δ) of about 1.6 to about 2.5 at frequencies of about 20,000 Hz to about 100,000 Hz and a temperature of about 25° C.,
wherein the protective layer, the first protective adhesive layer, the window, the second protective adhesive layer, and the display panel are arranged in this order, and
wherein the window is disposed directly on the second protective adhesive layer.

17. The display device of claim 16, wherein the first protective adhesive layer has a thickness of about 25 μm to about 65 μm.

18. The display device of claim 16, wherein each of the first protective adhesive layer, the second protective adhesive layer, and the third protective adhesive layer has a storage modulus of about 0.3 MPa or less at a temperature of about -20° C. and a frequency of about 1 Hz.

19. The display device of claim 16, wherein each of the first protective adhesive layer, the second protective adhesive layer, and the third protective adhesive layer has a storage modulus of about 0.05 MPa or less at a temperature of about 25° C. and a frequency of about 1 Hz.

20. The display device of claim 16, wherein each of the first protective adhesive layer, the second protective adhesive layer, and the third protective adhesive layer comprises a thermosetting resin or a photocurable resin.

* * * * *